(12) United States Patent
Wagenleitner

(10) Patent No.: US 10,134,622 B2
(45) Date of Patent: Nov. 20, 2018

(54) APPARATUS AND METHOD FOR ASCERTAINING ORIENTATION ERRORS

(75) Inventor: Thomas Wagenleitner, Aurolzmunster (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 33 days.

(21) Appl. No.: 14/405,419

(22) PCT Filed: Jun. 6, 2012

(86) PCT No.: PCT/EP2012/060677
§ 371 (c)(1),
(2), (4) Date: Dec. 4, 2014

(87) PCT Pub. No.: WO2013/182236
PCT Pub. Date: Dec. 12, 2013

(65) Prior Publication Data
US 2015/0138566 A1    May 21, 2015

(51) Int. Cl.
*H01L 21/68*    (2006.01)
*G01B 11/00*    (2006.01)
*G01B 11/27*    (2006.01)

(52) U.S. Cl.
CPC ............ *H01L 21/68* (2013.01); *G01B 11/002* (2013.01); *G01B 11/272* (2013.01); *H01L 21/681* (2013.01)

(58) Field of Classification Search
CPC ....................................................... H01L 21/68
USPC ........................................................ 356/401
See application file for complete search history.

(56) References Cited

U.S. PATENT DOCUMENTS

| 4,663,658 A | 5/1987 | Lanne et al. .................. 358/101 |
| 4,780,617 A | 10/1988 | Umatate et al. .............. 250/548 |
| 4,853,967 A * | 8/1989 | Mandeville .............. G06K 9/00 348/126 |
| 5,805,866 A * | 9/1998 | Magome ............. G03F 7/70858 355/53 |

(Continued)

FOREIGN PATENT DOCUMENTS

| JP | S56-146242 A | 11/1981 | ............. H01L 21/52 |
| JP | S61-44429 A | 3/1986 | ............... G03F 9/00 |

(Continued)

OTHER PUBLICATIONS

Office Action issued in corresponding Japanese Patent Application No. 2015-515396 dated Apr. 25, 2016.

(Continued)

*Primary Examiner* — Tarifur Chowdhury
*Assistant Examiner* — Omar Nixon
(74) *Attorney, Agent, or Firm* — Kusner & Jaffe

(57) ABSTRACT

A device for determining alignment errors of structures which are present on, or which have been applied to a substrate, comprising a substrate holder for accommodating the substrate with the structures and detection means for detecting X-Y positions of first markings on the substrate and/or second markings on the structures by moving the substrate or the detection means in a first coordinate system, wherein in a second coordinate system which is independent of the first coordinate system X'-Y' structure positions for the structures are given whose respective distance from the X-Y positions of the first markings and/or second markings can be determined by the device.

9 Claims, 4 Drawing Sheets

(56) References Cited

U.S. PATENT DOCUMENTS

| | | | | |
|---|---|---|---|---|
| 5,907,405 | A * | 5/1999 | Mizutani | G03F 9/70 356/399 |
| 5,981,117 | A * | 11/1999 | Magome | G03F 7/70283 430/22 |
| 5,991,007 | A * | 11/1999 | Narimatsu | G03F 7/70358 257/E21.001 |
| 6,008,880 | A * | 12/1999 | Higashiki | G03F 7/70591 355/53 |
| 6,647,632 | B2 | 11/2003 | Tominaga et al. | 33/1 M |
| 2002/0104231 | A1 | 8/2002 | Tominaga et al. | |
| 2004/0212801 | A1* | 10/2004 | Wu | G03F 9/7011 356/400 |
| 2004/0227925 | A1 | 11/2004 | Sato | |
| 2007/0146708 | A1* | 6/2007 | Hagiwara | G03F 9/7076 356/401 |
| 2008/0088843 | A1* | 4/2008 | Shibazaki | G03F 9/7003 356/399 |
| 2009/0027640 | A1* | 1/2009 | Shibazaki | G03F 7/70775 355/53 |
| 2010/0195102 | A1* | 8/2010 | Den Boef | B29C 43/021 356/401 |

FOREIGN PATENT DOCUMENTS

| | | | | |
|---|---|---|---|---|
| JP | H06-181169 A | 6/1994 | | G03F 7/22 |
| JP | H09-283404 A | 10/1997 | | G03F 7/20 |
| JP | 2002-228415 A | 8/2002 | | G01B 11/00 |
| WO | WO 92/05399 A1 | 4/1992 | | G05B 19/402 |
| WO | WO-2010023935 A1 | 3/2010 | | |

OTHER PUBLICATIONS

International Search Report from corresponding International Patent Application No. PCT/EP2012-060677, dated Sep. 5, 2012.

* cited by examiner

APPARATUS AND METHOD FOR ASCERTAINING ORIENTATION ERRORS

FIELD OF THE INVENTION

The invention relates to a device for determining alignment errors and/or distortions of structures which are present on a substrate, or which have been applied to it.

BACKGROUND OF THE INVENTION

Hereinafter, the term "structures" is defined as all types of elements which are produced by various chemical and/or physical processes directly on a wafer or which are externally produced and are joined to the wafer by any alignment process or placement process.

Examples of structures which are produced directly on the wafer are vapor-deposited conductor paths, ICs produced lithographically on the wafer, for example CMOS or TTL logics, sensors, etching structures, MEMS, etc.

On the other hand, a wafer can also be provided with components by an insertion process. The most common example for an insertion process would be the application of chips in a chip-to-wafer process by a pick-and-place (i.e., transfer) device. These components represent 3D expansions of the basic structure of the wafer. These components are also encompassed by the term "structures," as used herein.

All the aforementioned structures can have deviations from the ideal. For example, conductor paths can have slight distortions due to faults in the mask. It would furthermore be conceivable that the conductor paths have indeed been correctly produced on the wafer, but in a subsequent bond process such a high pressure is applied to the wafer that the conductor's surface and thus also the conductor paths are distorted. Furthermore distortions of the surface can arise due to other technical-physical and/or chemical influences, for example by thermal stresses, thermal shock, inherent stresses, etc. Similar considerations apply to all structures which have been applied directly to a wafer.

In structures which are applied by an insertion process to the wafer surface, the positioning and/or alignment of the structure can be faulty. In this case distortion is defined as distortion of the applied structure itself, predominantly caused by torsion and shearing.

Alignment in bond processes, especially chip-to-wafer methods, is becoming increasingly more important due to the 3D technology which is becoming more and more important in combination with advancing miniaturization. This acquires importance mainly in applications in which alignment accuracies of less than 2 µm for all sites located on the wafer are desired. The importance and demands on the accuracy of alignment technology are still increasing greatly for desired accuracies less than 1 µm, especially less than 0.5 µm, or less than 0.25 µm.

Due to the fact that the structures are becoming smaller and smaller, but the wafers at the same time are becoming larger and larger, structures which are very well aligned to one another may be present in the vicinity of alignment marks, while at other positions of the wafer the structures have not been correctly or at least not optimally placed.

For this reason, metrology tools are used for checking of alignment accuracies. EP 2299472 shows a method in which it is possible to measure the entire surface of a wafer in order to obtain information about the positions of the structures on the surface of each wafer.

The structures mentioned here can be deformed in exactly the same manner by high pressures, thermal stresses, inherent stress, thermal shocks, etc.

The object of this invention is to develop a generic device and a generic method such that checking of the alignment accuracy and/or of the distortion more efficiently and more accurately is enabled.

This object is achieved with the features of the claims. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

In accordance with the invention, two coordinate systems are provided, namely, the X-Y coordinate system, also called the first coordinate system, and the X'-Y' coordinate system, also called the second coordinate system.

The first coordinate system allows translational and/or rotary motion of the receiving unit and thus of the substrate holder with the wafer loaded onto it and the positioning relative to at least one, preferably several optics, which have been mounted in a fixed manner. The optics can preferably also move in translation and rotation, for calibration of the optical axis or of the optics, relative to the first coordinate system. Conversely, the receiving unit with the substrate holder can also be fixed during the determination of the alignment errors and the optics can be movable. In this case, at the start a position of the substrate holder or substrate would be fixed as the origin of the first coordinate system.

The origin of the first coordinate system lies preferably in the optical axis of the detections means, especially one of the optics.

The second coordinate system is a coordinate system which is defined in the computer and with reference to which a structure position field is defined.

The invention is based on the idea of comparing the actual X-Y positions (detected in the first coordinate system), namely, the actual alignment in the X-Y plane, of a structure which are present on the substrate, to the ideal X'-Y' structure positions of a structure position field which has been generated in the computer, which latter positions are stored in the second coordinate system. The structure position field is preferably defined with respect to the second coordinate system, which is joined in a fixed manner to the alignment unit and the sample holder.

According to the invention, the substrate (wafer) is positioned by alignment mark (markings on the substrate) relative to the second coordinate system, preferably by translational and/or rotary motion. The structure position field is then in the ideal case congruent with the X-Y positions of the structures present on the wafer. Alternatively, a software correlation with the second coordinate system takes place so that a transformation of the two coordinate systems is possible.

Due to the alignment of the substrate by means of its alignment marks (markings) to the second coordinate system, not only are errors in the movement/assignment/detection by the detection means and their movement relative to the substrate holder or the substrate minimized, and even precluded, but also much more efficient and faster detection is enabled.

In the following description, substrates, such as wafers, and the structures, such as chips which are applied to wafers, in several layers (so-called 3DIC chips), or structures which have been produced directly on the wafer by various processes, are not mentioned in detail. Due to the independence of the X-Y structure positions assigned to the second coordinate system, the invention is especially suited for applying several layers of chips (or several layers of structures applied directly on the wafer by different processes which are not mentioned in detail) since error propagation or error multiplication is avoided by the measure as claimed in the invention.

Based on the detection in an external coordinate system (second coordinate system) (assigned to the machine/device) the method as claimed in the invention is also suited for determining the distortions of the X-Y structures on the substrate which are caused for example by stresses which are induced in wafer bonding. The method can also be used when only one substrate to be bonded has been structured. This is the case for example in the production of back side illuminated image sensors.

The two coordinate systems are especially Cartesian coordinate systems which are each determined by X vectors (X direction) and Y vectors (Y direction) which intersect at the origin of the coordinate systems.

The device as claimed in the invention has detection means, i.e., optics, preferably several optics, preferably at least a microscope and/or a laser and/or a camera. The detection means can be moved in rotation by three degrees of freedom and in translation by three degrees of freedom in order to allow calibration. Preferably, the detection means are fixed or can be fixed during the method steps, as claimed in the invention. According to the invention, the relative motion between the wafer and the optics takes place as claimed in the invention by the active movement of the receiving unit with reference to the first coordinate system.

The distance of the X-Y positions of the first and/or second markings in the X direction and/or the Y direction in the second coordinate system to the given X-Y structure positions can be determined by preferably digitized superposition of the X-Y structure position assigned to each structure with the X-Y positions of the second markings, preferably by digital image acquisition of the structure.

The first markings, so-called alignment marks, are used for coarse and/or fine alignment of the substrate, which has been fixed on the substrate holder and/or for correlation of the position of the substrate in a first coordinate system to the second coordinate system in the X and Y direction, preferably in addition in the direction of rotation. According to preferred embodiment of the inventions, solely more finely resolved second markings are used to determine the origin of the second coordinate system so that it can be determined more accurately.

According to one advantageous embodiment of the invention, the detection means comprise at least one optics which can be fixed in the first coordinate system and which can be moved at least in the X and Y direction in the first coordinate system, preferably controlled by a control apparatus, for setting the origin of the first coordinate system. The detection means can comprise a single microscope or several microscopes which can be triggered preferably independently of one another.

It is especially advantageous if the optics, especially by focusing and/or moving in one Z direction which is perpendicular to the X and Y direction, has a field of view with which at least one structure at a time can be detected at the same time, preferably less than 17 structures at the same time, even more preferably less than 5 structures at the same time, ideally exactly one structure at the same time.

In one embodiment of the invention, alignment means are provided in the form of a receiving apparatus which accommodates the substrate holder and which can moved at least in the X and Y direction of the first coordinate system. The alignment means are intended for alignment of the substrate which is fixed on the substrate holder relative to the second coordinate system, by detecting the first markings on the substrate with the detection means.

To the extent the X-Y positions and/or the X-Y structure positions can be stored jointly in a position map which is assigned especially to the second coordinate system or which is correlated with it, prompt and efficient evaluation of the structures is possible. As a result, at any instant, when several structures are stacked on top of one another, a faulty structure alignment can be ascertained and corresponding countermeasures, such as for example re-alignment or marking as scrap, can be initiated.

One important aspect of this invention is that a device (or measurement device) as claimed in the invention in one preferred embodiment is provided separately from the alignment device as an independent module.

Features disclosed according to the device and also method features should be considered disclosed as an independent or combined invention and vice versa.

To the extent the method as claimed in the invention or the device as claimed in the invention are used in BSI CIS (back side illuminated contact image sensors), the determination of distortions in an exposure field for lithography, especially with a maximum size of 26×32 mm, is important. The order of magnitude of deviations is especially less than 250 nm, preferably less than 100 nm, still more preferably less than 70 nm, even more preferably less than 50 nm.

According to one embodiment of this invention, it is conceivable for the accuracy of detection of fields of view adjacent to distortions, which are referenced to the respectively detected field of view, to be considered by interpolation or other suitable transformation methods.

Other advantages, features and details of the invention will become apparent from the following description of preferred exemplary embodiments and using the drawings.

DETAILED DESCRIPTION OF THE PREFERRED EMBODIMENTS

The same components/features and those with the same effect are identified by the same reference numbers in the figures.

Figure 1A:
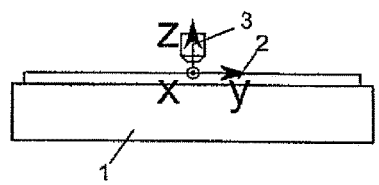
FIG. 1a shows a schematic cross sectional view of a device as claimed in the invention.
Figure 1B:
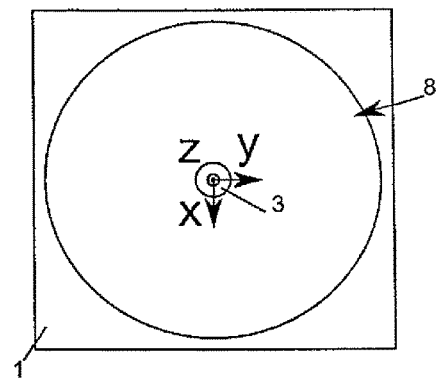
FIG. 1b shows a schematic plan view of the device according to FIG. 1a, FIG. 2a shows a schematic cross sectional view of a device as claimed in the invention with a loaded wafer which has not yet been coarsely adjusted.

FIGS. 1a and 1b show a receiving apparatus 1 which can be moved in the X and Y direction (first coordinate system), in translation, and in addition in one Z direction (perpendicular to the X and Y direction), in translation. Moreover, it is advantageous if the receiving apparatus 1 can be rotated, especially around an axis R of rotation at the centroid, or center, of the receiving region of a substrate holder 2. The substrate holder 2 can be fixed on the receiving apparatus 1.

Figure 2A:
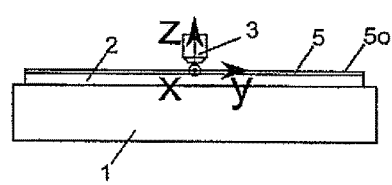
FIG. 2b shows a schematic plan view of the device according to FIG. 2a, FIG. 3a shows a schematic cross sectional view of a device as claimed in the invention with a loaded wafer which has already been coarsely adjusted.
Figure 2B:
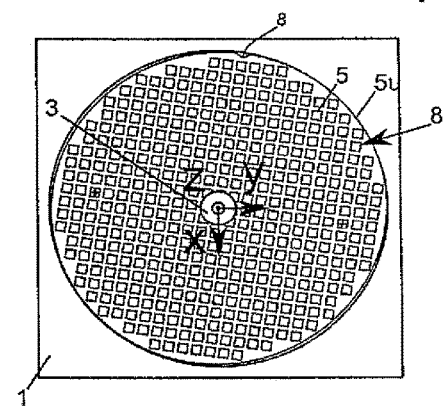

In FIGS. 2a and 2b, the substrate 5 is located on the substrate holder 2. The fixing takes place preferably by a vacuum, controlled by an software-supported control apparatus of the device, which apparatus is not shown. Alternatively, the fixing can also take place electrostatically or mechanically or by a combination of the aforementioned fixing techniques. The substrate 5 has not yet been coarsely adjusted in this process step; this can be easily recognized by the incorrect position of the substrate 5 in FIG. 2b.

The device furthermore comprises optics 3 (detection means) which is fixed on an optics receiver which is not shown.

The optics 3 is used to detect first markings 7, which have been applied on one surface 5o of the substrate 5 and to detect second markings 11, 11' on structures 6 which have been applied onto the substrate 5. The optics 3 can be designed for the visible, infrared, ultraviolet or any other wavelength range of the electromagnetic spectrum. It is important that the optics 3 allows pattern recognition of the first and second markings 7, 11, 11', especially in a digitizable form. To increase the speed and/or efficiency of detection it is conceivable to provide several optics 3. In such a case, the coordinate origin of the first coordinate system lies preferably on the optical axis of any optics.

Figure 3A:
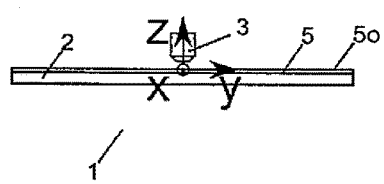
FIG. 3b shows a schematic plan view of the device according to FIG. 3a, FIG. 4a shows a schematic cross sectional view of a device as claimed in the invention, with optics position over a first alignment mark.
Figure 3B:
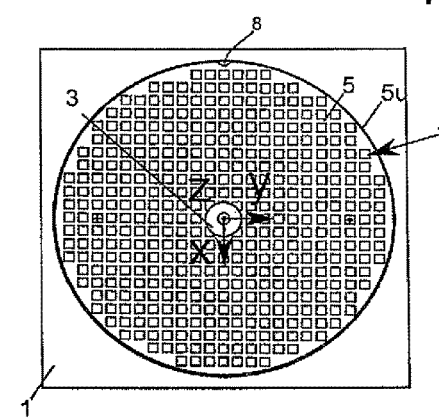
Figure 4A:
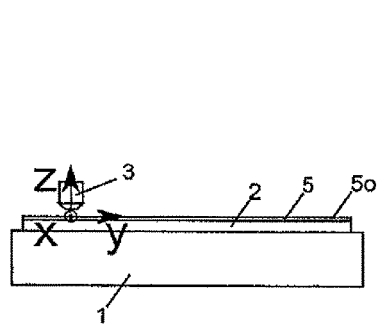
FIG. 4b shows a schematic plan view of the device according to FIG. 4a, FIG. 5a shows a schematic cross sectional view of a device as claimed in the invention with optics position over a second alignment mark.
Figure 4B:
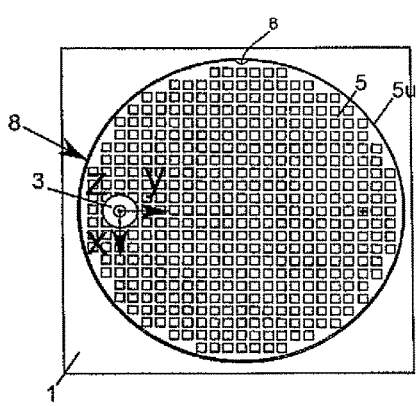

In a first step, the substrate 5 is positioned (FIG. 2a, 2b) on the substrate receiver 2 of the receiving apparatus 1 and coarsely aligned (FIG. 3a, 3b). The coarse alignment of the substrate 5 takes place via a contour 8 provided on the periphery 5u of the substrate 5, in particular a notch or a flat. The coarse alignment has an accuracy of less than 1000 μm, preferably less than 500 μm, still more preferably less than 100 μm, even more preferably less than 50 μm, still more preferably less than 15 μm. Here the substrate 5 is aligned in the direction of rotation around one axis R of rotation with a rotational accuracy of less than 1 degree, preferably less than 0.5 degree, still more preferably less than 0.1 degree, even more preferably less than 0.01 degree. Coarse alignment is defined here as a positioning of the substrate 5 in which the optics 3 has focused the first alignment marks 7 which are distributed on the surface 5o in the field of view. According to one preferred embodiment, the more finely resolved second markings 11, 11' are used for determination of the origin and of the alignment of the second X-Y coordinate system so that it can be determined more accurately. The second X-Y coordinate system is fixed by comparison and optionally positioning of the X-Y structures or markings with the corresponding given (stored) X-Y structure positions.

If the surface of the wafer and thus the markings 11, 11' and/or the alignment marks 7, 7' should already have been distorted, it is possible as claimed in the invention to detect all possible markings 11, 11' and/or alignment marks 7, 7' and deduce the origin of the second coordinate system by an algorithm. These algorithms are algorithms, which are known to one skilled in the art.

The coarse alignment can also comprise a wedge fault compensation, with respect to the optics 3. This can take place on the one hand by orthogonal alignment of one optical axis of the optics 3 or by acquisition of a focus map. The focus map is acquired by the focus setting of the optics 3 being determined at several locations and then the expected focus setting being computed for all other X-Y positions by interpolation. This leads to a further increase of efficiency of the method as claimed in the invention.

Using the X-Y positions of the first markings 7 on the substrate 5, the position of the first coordinate system is known and by fixing of the substrate 5 on the substrate holder 2 and of the receiving apparatus 1 the first coordinate system is fixed. It is decisive here that the receiving apparatus 1 need not be designed for an especially precise positioning accuracy. A positioning accuracy of >1 μm, especially >5 μm, preferably >10 μm is sufficient.

In one preferred embodiment of the invention, the position of the receiving apparatus 1 can be exactly detected, by a precise measurement system, preferably with a precision of less than 1000 nm, preferably less than 100 nm, still more preferably less than 10 nm, even more preferably less than 1 nm. Alternatively, instead of moving and detecting the receiving apparatus 1, the optics 3 can be moved, in this case there being preferably a corresponding detection of the optics 3 or of the optics receiver relative to the device.

With reference to the second coordinate system, ideal X-Y structure positions for the structures 6 which are distributed on the surface 5o are given, in the form of position crosses 9, stored in the control apparatus as the structure position map 12 (see FIG. 3) with a border 10 which corresponds to the outer contour of the substrate 5. The position crosses 9 preferably consist of a line 9x which runs in the x direction and a line 9y which runs in the Y direction, which lines cross at the ideal position (middle of the structure 6, see FIG. 8).

The X-Y structure positions can be fixed and optionally changed by software of the control apparatus so that the user can influence the positioning of the structures 6 on the surface 5o.

The device as claimed in the invention is used to determine alignment errors and/or distortions of structures 6 on the substrate 5. A deviation from this ideal position is determined by the device in order to be able to take corresponding measures in the case of an overly large deviation (metrology tool).

For further optimization of alignment errors, the first coordinate system and the second coordinate system are aligned as well as possible to one another, preferably exactly (fine adjustment), by parallel alignment of the X axes and Y axes of the two X-Y coordinate systems.

According to one invention alternative, it is also conceivable that instead of a fine adjustment, a software-supported coordinate transformation matrix is prepared. Due to the possibility of determining the position of the two coordinate systems to one another, there is in any case an unambiguous mathematical relationship between the two coordinate systems. The translational and/or rotary position of the one coordinate system with reference to the other one at the time can be detected in the form of a transformation matrix and automatically allows the actuation of each position from the standpoint of each coordinate system. These coordinate transformations are known to one skilled in the art.

The coarse alignment of the substrate 5 allows the optics 3 to quickly find the first markings 7. The number of first markings 7 is at least two, preferably at least three, even more preferably at least four, still more preferably at least six, even more preferably at least ten. The more markings there are for alignment, the more accurate the alignment of the coordinate systems to one another becomes.

The accuracy of the degrees of freedom of translation, in fine adjustment, is less than 1000 nm, preferably less than 100 nm, still more preferably less than 10 nm, even more preferably less than 1 nm. The accuracy of the degrees of freedom of rotation here is less than 0.01 degree, preferably less than 0.001 degree, still more preferably less than 0.0001 degree. Alternatively, the position of the receiving apparatus 1 can be measured so that in this case such translational movement accuracy can be omitted.

Since the X-Y structure positions for the structures 6 are given, each structure 6 on the surface 5o can be moved into a field of view 13 of the optics 3 by a precise approach of the X-Y structure positions. In the field of view 13, the deviation of the X-Y structure positions can be determined by the X-Y positions of the second markings 11, 11' on the structures 6, especially separately in the X direction (dx) and Y direction (dy).

Figure 8:
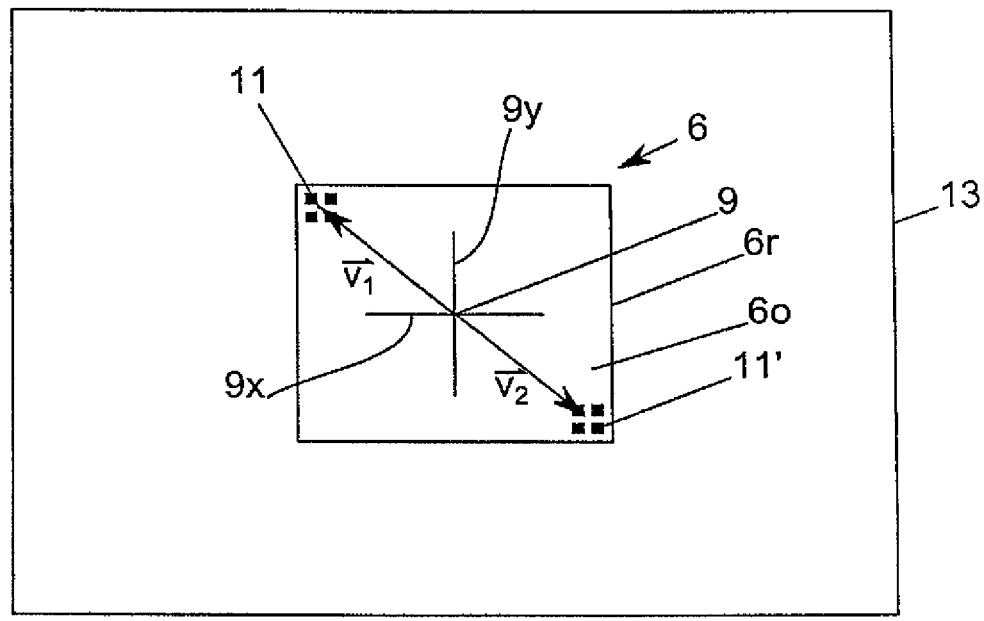
FIG. 8 shows an enlargement of a substrate with a perfectly aligned and contacted structure and FIG. 9 shows an enlargement of a substrate with an imperfectly aligned and contacted structure.
Figure 9:
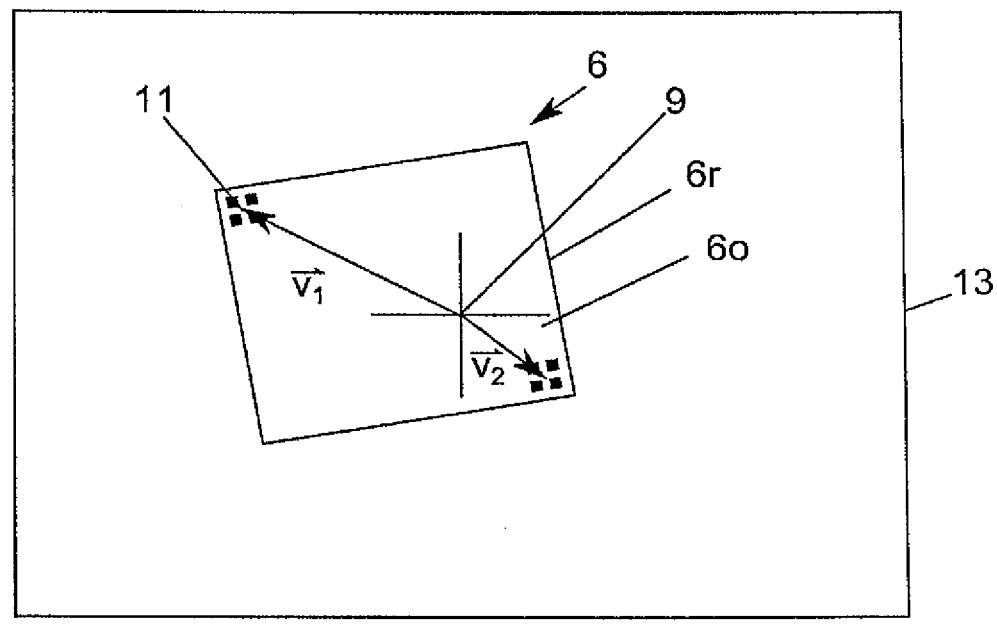

FIG. 8 shows an enlargement of the structures 6, recorded by an objective lens of the optics 3, therefore enlarged accordingly. One surface 6o and one edge 6r of the recorded structure 6, i.e., of a chip, can be recognized. Second markings 11, 11' are also features of the structure 6 itself, for example its surface structure or the structure of the edge 6r. Preferably on each structure 6 at least two, preferably four second markings 11, 11' are attached respectively on opposing corners of the structure 6. The position cross 9 relative to the structure 6 is displayed controlled by software based on the stored X-Y positions of the pertinent structure 6. The position cross 9 is thus not physically applied to the structure and is not a second marking 11, 11'.

The recorded image of the structure 6 is thus more or less superimposed with the position cross 9, with a live image so that the position cross 9 is not necessarily present in the storage of the digital image of the structure 6 for recording and determining the positions of the second markings 11, 11' Likewise, the position cross 9 can be stored superimposed together with the digital image.

The structure 6 shown in FIG. 8 is ideally positioned and/or undistorted since the position cross 9 is located exactly in the middle of the structure 6, with an identical distance of the position cross 9 to the two second markings 11, 11' which are located in opposite corners.

Figure 5A:
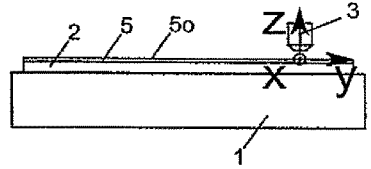
FIG. 5b shows a schematic plan view of the device according to FIG. 5a, FIG. 6 shows a plan view of a substrate with structures.
Figure 5B:
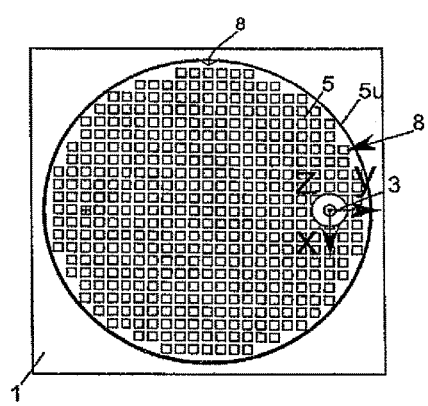
Figure 6:
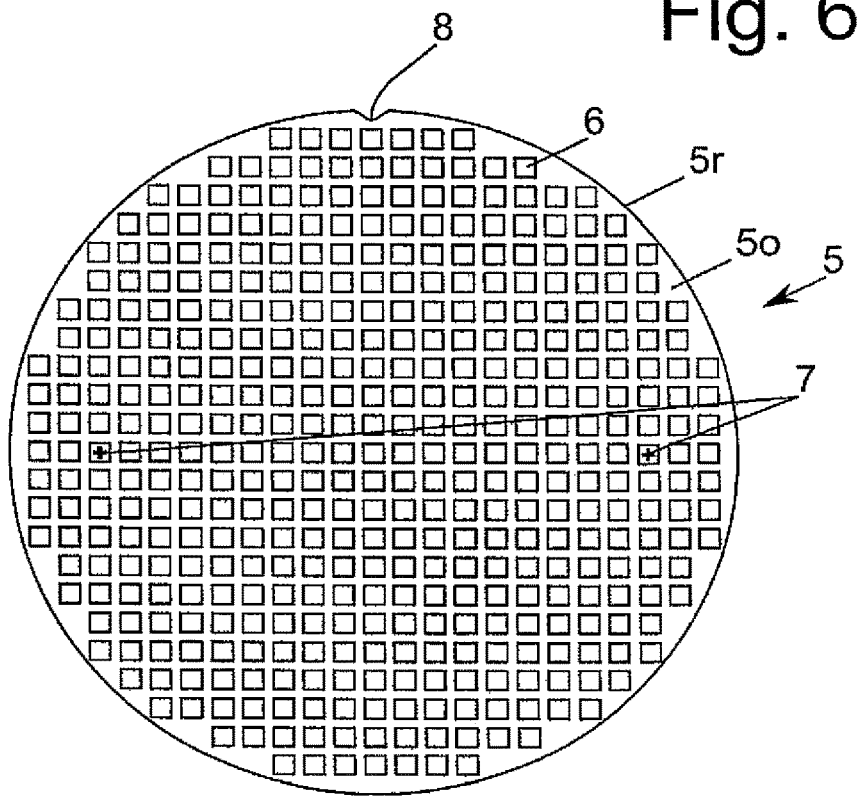
Figure 7:
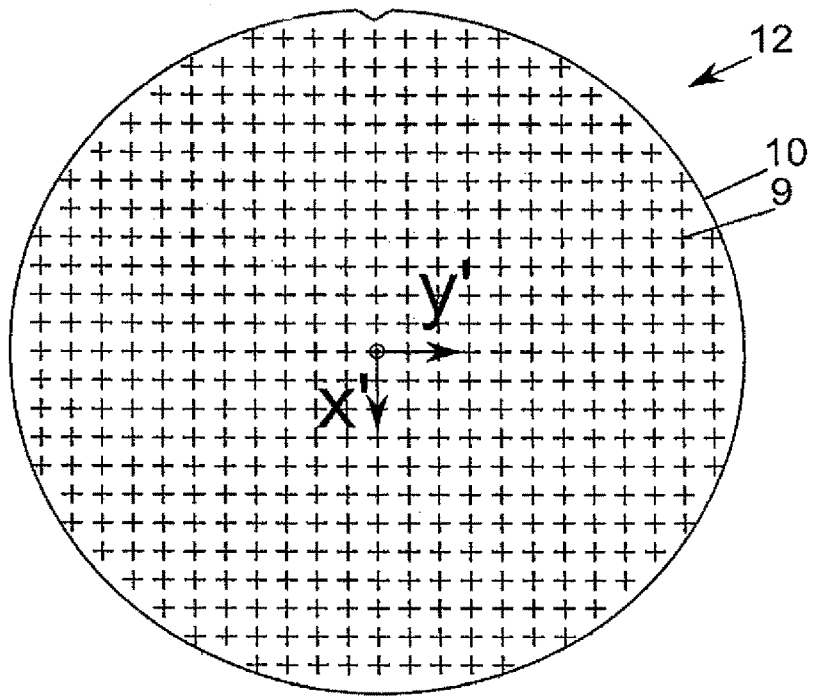
FIG. 7 shows a schematic of X-Y structure positions as claimed in the invention.

In the structure 6, which is shown in FIG. 5, it can be recognized that both the distances of the second markings 11, 11' from the position cross 9 and also their alignment in the direction of rotation are different from the ideal position. Based on boundary values which can be fixed especially in the software, it can be directly ascertained whether the structure 6 is suitable for further processing or must be treated as scrap.

These boundary values can be established for each deviation vector, vector $V_1$, $V_2$, or for their vector sum and/or the rotational position.

The receiving apparatus 1 can also be fixed, while the optics 3 is moving. All the inventive ideas named in the patent specification apply analogously since the method depends only on a relative movement between the receiving apparatus 1 and the optics 3. The movement of the optics 3 instead of the receiving apparatus 1 has the advantage that only a relatively small optics, with relatively little mass, must be moved. Furthermore, the embodiment of the apparatus is more compact since the large-area receiving apparatus 1 need not be moved over a still larger area. The disadvantage of this embodiment is the high susceptibility to vibration of the optics due to its small mass which adversely affects the determination of the alignment errors and/or distortion errors.

Accordingly, at any instant of a process sequence, after treatment of the substrate, it can be checked by means of the invention whether the X-Y position have [sic] changed significantly relative to the given X-Y structure positions and/or the X-Y positions determined prior to the treatment step.

Therefore, the method in the illustrated embodiment has the following steps, and individual steps can be replaced by the alternatives named above:
1. loading of a substrate 5 with structures 6 into the device,
2. coarse positioning of the substrate 5,
3. fixing of the substrate 5 relative to the receiving apparatus 1,
4. fine alignment of the substrate 5 using the first alignment marks 7 and/or markings 11, 11' by translational and/or rotary movement of the receiving apparatus 1,
5. scanning/following of all X-Y structure positions by moving the receiving apparatus 1,
6. recording of a digital image on each X-Y structure position by the optics 3,
7. determination of the deviation of the X-Y positions of each structure 6, of the second markings 11, 11' of each structure, from the X-Y structure position and
8. output and/or storage of the movement data, in the form of a position map, encompassing X-Y positions and X-Y structure positions of each structure 6.

REFERENCE NUMBER LIST 1 receiving apparatus
2 substrate holder
3 optics
5 substrate
5u periphery
5o surface
6 structures
6o surface
6r edge
7 first markings
8 contour
9 position cross
9x line
9y line
10 border
11, 11' second markings
12 structure position map
13 field of view
$V_1$, $V_2$ deviation vectors
R axis of rotation
X X direction
Y Y direction
Z Z direction Having described the invention, the following is claimed:

1. A device determining alignment errors of structures which are present on, or which have been applied to, a substrate, comprising:
   at least one fixable optic that is fixed in a first coordinate system when recognizing first alignment marks and respective X-Y positions of second alignment marks, the optic being configured to recognize the first alignment marks distributed on a surface of the substrate in a field of view of the optic to set an origin of the first coordinate system, the optic being further configured to recognize the respective X-Y positions of the second alignment marks positioned on the structures in the field of view of the optic after the origin of the first coordinate system is set;
   a substrate holder configured to fixably hold the substrate and translationally and/or rotationally move in an X and Y direction in the first coordinate system to position the substrate in the field of view of the optic such that the origin of the first coordinate system can be set and the respective X-Y positions of the second alignment marks can be recognized; and
   a computer configured to define a second coordinate system in which ideal X'-Y' structure positions for the structures are given, the second coordinate system being independent of the first coordinate system, the computer being further configured to generate and store the respective ideal X'-Y' structure positions for the structures defined with reference to the second coordinate system, the computer being further configured to determine respective distances between the ideal X'-Y' structure positions for the structures and the recognized X-Y positions of the second alignment marks on the structures that respectively correspond with the ideal X'-Y' structure positions for the structures, the computer being further configured, after treatment of the substrate, to perform a post-treatment determining of post-treatment respective distances between the ideal X'-Y' structure positions for the structures and post-treatment X-Y positions of the second alignment marks on the structures that respectively correspond with the ideal X'-Y' structure positions for the structures,
   wherein the optic is fixed in the first coordinate system when recognizing the post-treatment X-Y positions of the second alignment marks, and
   wherein the optic is further configured to recognize the post-treatment X-Y positions of the second alignment marks on the structures to enable the computer to perform the post-treatment determining.

2. The device as claimed in claim 1, wherein the second coordinate system is a coordinate system with reference to which a structure position field is defined, the structure position field comprising the respective ideal X'-Y' structure positions for the structures.

3. The device as claimed in claim 1, further comprising an alignment means, in the form of a receiving apparatus which accommodates the substrate holder and which can move in the X and Y direction of the first coordinate system, the alignment means being configured to align the substrate relative to the second coordinate system according to the recognized X-Y positions of the second alignment marks.

4. The device as claimed in claim 1, wherein the recognized X-Y positions of the second alignment marks and/or the ideal X'-Y' structure positions for the structures are stored jointly in a position map which is assigned to the second coordinate system or which is correlated with it.

5. The device as claimed in claim 1, wherein the substrate holder is further configured to translationally move in a Z direction in the first coordinate system.

6. A method for determining alignment errors of structures which are present on, or which have been applied to, a substrate accommodated by a substrate holder, the method being comprised of the following steps:
   fixing the substrate on the substrate holder, the substrate having first alignment marks distributed on a surface and second alignment marks positioned on the structures;
   moving the substrate holder translationally and/or rotationally in an X and Y direction in a first coordinate system to position the substrate in a field of view of at least one fixable optic, the first and second alignment marks being in the field of view of the optic;
   first recognizing, via the optic, the first alignment marks to set an origin of the first coordinate system;
   second recognizing, via the optic, respective X-Y positions of the second alignment marks after the origin of the first coordinate system is set;
   defining, using a computer, a second coordinate system in which ideal X'-Y' structure positions for the structures are given, the second coordinate system being independent of the first coordinate system;
   generating and storing, using the computer, the respective ideal X'-Y' structure positions for the structures defined with reference to the second coordinate system;
   determining respective distances between the ideal X'-Y' structure positions for the structures and the recognized X-Y positions of the second alignment marks on the structures that respectively correspond with the ideal X'-Y' structure positions for the structures;
   treating the substrate;
   post-treatment recognizing, via the optic, post-treatment X-Y positions of the second alignment marks on the structures; and
   post-treatment determining of post-treatment respective distances between the ideal X'-Y' structure positions for the structures and the post-treatment recognized X-Y positions of the second alignment marks on the structures that respectively correspond with the ideal X'-Y' structure positions for the structures,
   wherein the optic is fixed in the first coordinate system during the first recognizing, the second recognizing, and the post-treatment recognizing.

7. The method as claimed in claim 6, wherein an alignment of the substrate relative to the second coordinate system, according to the recognized X-Y positions of the second alignment marks, takes place by alignment means that is in the form of a receiving apparatus which accommodates the substrate holder and which can move in the X and Y direction of the first coordinate system.

8. The method as claimed in claim 6, wherein the recognized X-Y positions of the second alignment marks and/or the ideal X'-Y' structure positions for the structures are stored especially jointly in a position map which is assigned especially to the second coordinate system or which is correlated with it.

9. The method as claimed in claim 6, wherein the substrate holder is further translationally moved in a Z direction in the first coordinate system.

* * * * *